US011887662B2

(12) United States Patent
Grenouillet et al.

(10) Patent No.: US 11,887,662 B2
(45) Date of Patent: Jan. 30, 2024

(54) MATRIX OF ELEMENTARY SWITCHES FORMING A MESSAGE, ASSOCIATED READING AND WRITING METHODS

(71) Applicant: COMMISSARIAT À L'ÉNERGIE ATOMIQUE ET AUX ÉNERGIES ALTERNATIVES, Paris (FR)

(72) Inventors: Laurent Grenouillet, Grenoble (FR); Anthonin Verdy, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 87 days.

(21) Appl. No.: 17/575,045

(22) Filed: Jan. 13, 2022

(65) Prior Publication Data
US 2022/0223206 A1    Jul. 14, 2022

(30) Foreign Application Priority Data
Jan. 14, 2021    (FR) ........................................ 2100321

(51) Int. Cl.
*G11C 13/00*    (2006.01)
(52) U.S. Cl.
CPC ........ *G11C 13/0038* (2013.01); *G11C 13/003* (2013.01); *G11C 2213/52* (2013.01); *G11C 2213/53* (2013.01)
(58) Field of Classification Search
CPC .............. G11C 13/0038; G11C 13/003; G11C 2213/52; G11C 2213/53; G11C 13/004; G11C 13/0002; G11C 13/0069; G11C 13/0059; G11C 16/105
See application file for complete search history.

(56) References Cited

U.S. PATENT DOCUMENTS

| 2014/0201851 A1* | 7/2014 | Guo ......................... G09C 1/00 726/34 |
| 2015/0243352 A1* | 8/2015 | Park ................... G11C 13/0004 365/163 |
| 2018/0091300 A1* | 3/2018 | Tomishima ........... G11C 11/161 |
| 2019/0165938 A1* | 5/2019 | Lu .......................... B25J 9/1692 |
| 2019/0198096 A1* | 6/2019 | Mirichigni .......... G11C 11/5642 |

(Continued)

FOREIGN PATENT DOCUMENTS

EP    2 765 577 A1    8/2014
WO    WO 2020/049363 A1    3/2020

OTHER PUBLICATIONS

Search Report as issued in French Patent Application No. 2100321, dated Sep. 30, 2021.

(Continued)

*Primary Examiner* — Khamdan N. Alrobaie
(74) *Attorney, Agent, or Firm* — Pillsbury Winthrop Shaw Pittman LLP (57) ABSTRACT

A matrix includes a plurality of volatile switches, each of the volatile switches including an active layer made of an OTS material, the plurality of volatile switches being divided into two groups in such a way as to form a message, each of the volatile switches of the first group having been initialized beforehand by an initialization voltage, none of the volatile switches of the second group having been initialized beforehand, the message being formed by the initialized or non-initialized states of each of the switches of the matrix.

13 Claims, 7 Drawing Sheets

(56) References Cited

U.S. PATENT DOCUMENTS

2019/0363898 A1* 11/2019 Ju .......................... G11C 7/24
2020/0279604 A1* 9/2020 Sforzin ................ G11C 13/004

OTHER PUBLICATIONS

Tseng, P.H. et al., "Error free physically unclonable function with programmed resistive random access memory using reliable resistance states by specific identification-generation method," Japanese Journal of Applied Physics 57, 04FE04, (2018), 7 pages.

* cited by examiner

MATRIX OF ELEMENTARY SWITCHES FORMING A MESSAGE, ASSOCIATED READING AND WRITING METHODS

CROSS-REFERENCE TO RELATED APPLICATIONS

This application claims priority to French Patent Application No. 2100321, filed Jan. 14, 2021, the entire content of which is incorporated herein by reference in its entirety.

A. TECHNICAL FIELD OF THE INVENTION

The technical field of the invention is that of matrices of elementary switches intended to form a random or predetermined message comprising a plurality of resistive switches. The present invention also relates to a method for writing or programming and a method for reading the matrix. The targeted applications are notably but not in a limiting manner those of cybersecurity such as the security of electronic components, the security of IoT (Internet of Things) components, combatting the forgery of electronic chips, the authentication of electronic chips and data, the storage of confidential information (storage of keys or encrypted messages for example), the inscription of codes. All of these applications require a high level of confidentiality.

B. TECHNOLOGICAL BACKGROUND OF THE INVENTION

Applications requiring discrimination between a legitimate device and a counterfeit device are more and more numerous, notably in the field of cybersecurity. This is the case for example of IoT connected objects which need to be made more and more secure in order to avoid cloning. It is also the case of other more common products of which it is wished to ensure authenticity, ranging from tamper-proof labels of medicines or bottles of wine to electronic devices. A known solution to this security requirement consists in using a challenge-response mechanism which makes it possible to make an authentication while being protected from attack by emulation (replaying or repeating different challenges making it possible to access the function). This technique, called Physical Unclonable Functions (PUF) is based on a tamper-proof microchip which makes it possible to secure objects in the form of a label or to be directly integrated in another device during manufacture. The PUF device comprises a code or function that is specific thereto, such as a "fingerprint" which differs for each human being. This function must be virtually unique for each device (one speaks of high inter-chip or between each chip variability) and to give virtually the same response when the challenge is applied thereto several times (one speaks of low intra-chip or within a same chip variability). A user of a device can ask the manufacturer for a challenge (or a challenge-response pair). The challenge C is applied to the device; the user then calculates the response R to the challenge C via the function F present in the device and compares the latter with the expected response. This operation may be repeated several times and each time the same response R is obtained. The function F specific to each device is obtained during the method for manufacturing or securing the chip (or integrated circuit) associated with the device via random physical implementation steps introducing discernible characteristics ensuring the uniqueness of the chip.

A known implementation of PUF technology is described in the publication "Error free Physically Unclonable Function (PUF) with programmed ReRAM using reliable resistance states by Novel ID-Generation method" (Tseng et al. —International Conference on Solid State Devices and Materials 2017). This is based on the use of a matrix of non-volatile rewritable ReRAM resistive memories such as OxRAM memories comprising a metal oxide active zone (Oxide Resistive RAM). These memories are resistive type memories, that is to say that they can have at least two resistance states, corresponding to a High Resistance State (HRS) and a Low Resistance State (LRS), under the application of a voltage.

Resistive memories require two upper and lower electrodes to operate. For example, OxRAM memories have a M-I-M (Metal-Insulator-Metal) structure comprising an active material of variable electric resistance, in general a transition metal oxide (e.g. $WO_3$, $HfO_2$, $Ta_2O_5$, $TiO_2$, etc), arranged between two metal electrodes. The passage from the "HRS" state to the "LRS" state is governed by the formation and the rupture of a conductive filament between the two electrodes. By modifying the potentials applied to the electrodes, it is possible to modify the distribution of the filament, and thus to modify the electrical conduction between the two electrodes. In the active layer, the electrically conductive filament is either broken, or conversely reformed, to vary the resistance level of the memory cells, during writing cycles then resetting this cell to zero (operations of SET, when the filament is reformed ending up with the LRS state, and of RESET ending up with the HRS state, when the filament is broken again by respective application of a SET, VSET or RESET, VRESET voltage to the terminals of the electrodes). The manufacture of a filament memory comprises a so-called "forming" step, in the course of which the filament is formed for the first time in the active layer, initially exempt of filament. The active layer is in fact initially completely electrically insulating. During the initial "forming" step, an electrically conductive filament is formed in the active layer, by carrying out a sort of controlled breakdown of this layer. The filament thus formed then extends right through the active layer, electrically connecting the lower electrode and the upper electrode. To carry out this forming step, it is possible for example to apply an electric voltage between the lower electrode and the upper electrode of the considered memory cell, then to increase progressively this voltage value up to a threshold voltage, called forming voltage Vforming, beyond which breakdown of the active layer is obtained. After this "forming" step, the memory cell is ready for use. The conductive filament may then be broken, then reformed, then broken again and so on, at a voltage value lower than the forming voltage Vforming.

OxRAM resistive memories notably have the interest of being able to be integrated with high densities, via "crossbar" matrix type integration.

Figure 1:
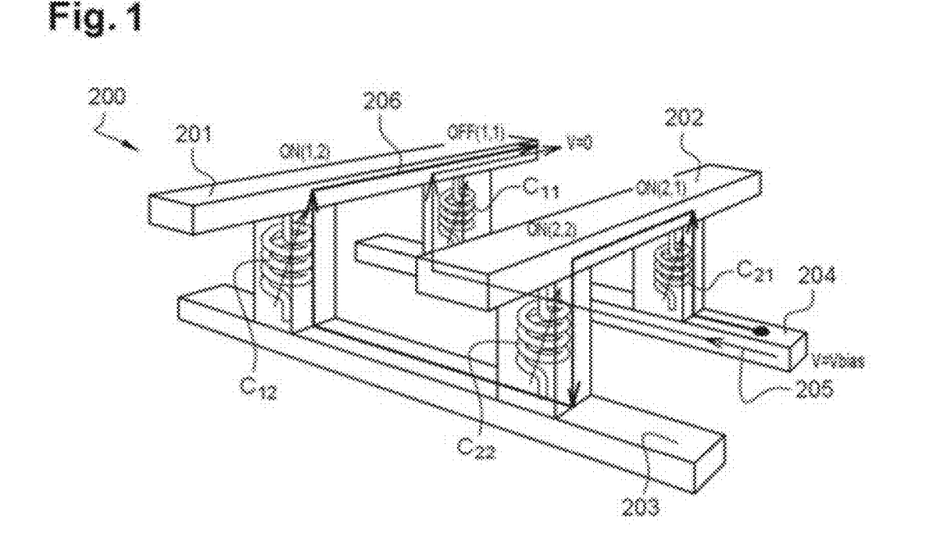
FIG. 1 represents an architecture for addressing a plurality of memory cells according to the prior art.

Such an architecture 200 is illustrated in FIG. 1 and comprises a plurality of access lines 201, 202, 203, 204 and a plurality of non-volatile rewritable memory cells (here four cells C11, C21, C22, C12) based on active materials (for example OxRAM cells). The access lines are formed by upper parallel bit lines 201, 202 and lower word lines 203, 204 perpendicular to the bit lines, the elementary cells C11, C21, C22, C12 being sandwiched at the intersection between the bit lines 201, 202 and the word lines 203, 204. The architecture 200 thus forms a network where each memory cell is addressable individually, by selecting the correct bit line and the correct word line.

Such an architecture makes it possible to implement PUF technology by randomly passing a part of the OxRAM cells to the SET state and by leaving the other part in the pristine state (that is to say that these cells have not undergone the same initial forming step).

Figure 2:
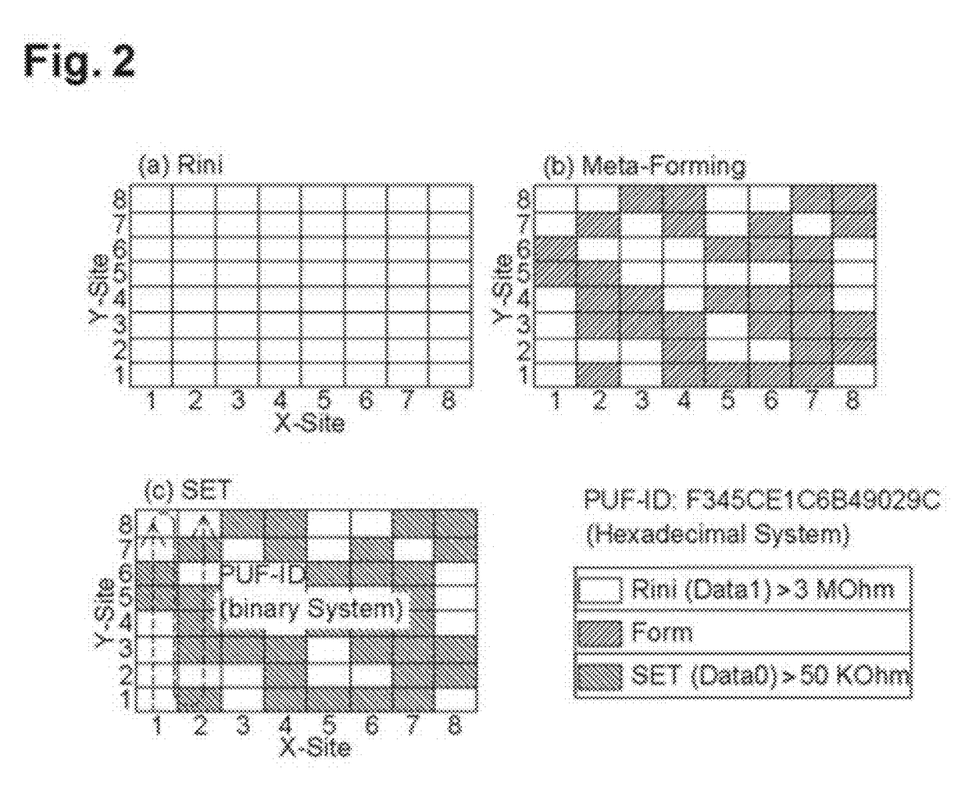
FIG. 2 illustrates the steps of writing a code in a matrix of OxRAM cells according to the prior art.

The different steps (a), (b) and (c) enabling this implementation are illustrated in FIG. 2. A matrix of 64 (8 lines and 8 columns) non-volatile cells, of OxRAM type, is represented. During step (a), all of the cells are in the pristine state: they are thus not formed and have a very high pristine resistance Rini (i.e. greater than 3 Mohm). During step (b), a step of random "forming" (designated by the term Metaforming) is carried out, that is to say that substantially half of the cells are formed by application of a suitable forming voltage. To do so, a forming voltage corresponding to the median of the distribution of the forming voltages of this type of OxRAM cell is applied to all of the matrix. During this step (b), half of the cells see their resistance drop by the first formation of a conductive filament. Finally, during step (c), step (b) is reinforced by the application of a SET voltage, making it possible to pass the cells formed at step (b) to a low resistance state LRS with a resistance lower than 50 kOhms. At the end of this step (c), the matrix has a random code corresponding to the random distribution between cells in the SET state and cells in the pristine state. It is then possible to read the code by applying a reading voltage, much lower than the forming and SET voltages, typically of the order of 0.1 to 0.5V, a relatively wide voltage interval.

The solution described above is simple to implement but does not however ensure optimal security. Indeed, an undesirable user knowing the operating principle of OxRAM cells, knows the order of magnitude of the reading voltages and will be able to obtain the code.

The same type of problem is posed in the case of OTP (One Time Programmable) applications in CRC (Cyclic Redundancy Check) type integrity checks or in security flags for detecting an intrusion or an undesired event in the programming of a chip. The CRC is a predetermined error detection code commonly used in digital networks and memory storage devices in order to detect potential accidental modifications occurring during data transfer. This code must be known and not easily accessible.

C. SUMMARY OF THE INVENTION

The invention offers a solution to the aforementioned problems, notably by proposing a matrix of elementary resistive switches intended to form a random or predetermined message with a degree of security and confidentiality greater than existing solutions, notably OxRAM based.

More specifically, the subject matter of the invention is a matrix comprising a plurality of volatile switches, each of said volatile switches comprising an active layer made of an OTS material, the plurality of volatile switches being divided into two groups in such a way as to form a message,
  each of the volatile switches of the first group having been initialized beforehand by means of an initialization voltage,
  none of the volatile switches of the second group having been initialized beforehand,
  said message being formed by the initialized or non-initialized states of each of the switches of the matrix.

OTS material is taken to mean a so-called "Ovonic Threshold Switching" material. The active OTS material is a chalcogenide alloy chosen to ensure the operation of a volatile resistive switch according to the principle represented in FIG. 3, which represents the current-voltage characteristic of an OTS switch at the moment of initialization or forming, that is to say during first use (curve C1) and after initialization or forming (curve C2). After forming, according to curve C2, the switch is highly resistive in the OFF state. As soon as a voltage greater than a threshold voltage Vth is applied to the switch, the current increases rapidly to reach the ON state of the device, a low resistance state. As soon as the current or the voltage is reduced below a specific so-called "holding" value Ih, the device returns to OFF, hence the volatile character of the switch. Before being able to operate in its nominal mode (that is to say to be able to pass from an ON state to an OFF state and vice versa), the switch must be firstly initialized (curve C1), the initialization consisting in applying an initialization voltage (also called forming voltage) Vforming to the terminals of the switch to initialize. The application of this forming or initialization voltage enables the initially highly resistive OTS active zone to be made conductive. It is also to be noted that the resistance of the ON state is independent of the initialized or non-initialized state of the switch. It is not possible to have any information on the state of the switch (pristine or initialized) by measuring the resistance of the ON state. It will be noted that OTS materials furthermore have the particularity of having very low leakage currents in the OFF state and a high ratio between the current in the ON state and the current in the OFF state making it possible to clearly distinguish these two states.

Thanks to the invention, the non-volatile aspect of the initialization or forming of an OTS material used in a switch having a volatile character in resistive terms is advantageously used. Put another way and as explained above, an OTS switch loses its low resistance state when the current or voltage is reduced below its holding value, thus loses its low resistance state in the absence of supply: the OTS switch is thus very volatile in resistive terms. On the other hand, once formed, the switch retains the forming operation "in memory" even if it becomes highly resistive again once the forming operation terminated and in the absence of a threshold voltage applied to its terminals, the forming operation being carried out once and for all, hence the non-volatile side of the forming.

The matrix, having only a part of its switches formed, is based on the following operating principle: the code contained in the matrix is represented by the identification of formed and non-formed switches. Unlike matrices made of OxRAM cells of the prior art, the matrix according to the invention only comprises, in the absence of voltage applied to its terminals, high resistance switches, whether they are formed or not. Thus, if it is sought to read the code hidden in the matrix, it is necessary to find the correct reading voltage without destroying the code, making access to the code much more difficult than in known matrices. Indeed, if a too low reading voltage is applied (i.e. below the threshold voltages of the OTS switches), all of the switches will remain in the high resistance state and it will not be possible to access the code. It is however what those skilled in the art will seek to do intuitively because the reading voltages used for reading resistive switches are generally much lower than the threshold and initialization voltages of these switches. The threshold voltage of an OTS switch is lower than or equal to its forming voltage. Thus, conversely, if a too high reading voltage is used greater than the forming voltage, there is a risk of forming certain initially non-formed switches, and thus of modifying the code present in the matrix. It will be understood that the reading voltage must be chosen meticulously and that the latter depends on the characteristics of the OTS switches present in the matrix, only known to the manufacturer, such as the shape, the size, the thickness of the layer and the material of the active layer and the electrodes situated on either side of the active layer. To be read correctly, it is thus necessary to use a reading voltage comprised between the threshold voltage and the forming voltage; given the dispersion of the threshold voltages and forming voltages linked to the plurality of switches present in the matrix (even in the case of switches identical structurally), the reading voltage used will have to lie between the maximum voltage of the distribution of the threshold voltages of the switches present in the matrix and the minimum voltage of the distribution of the initialization voltages of the switches present in the matrix. It will be noted that the use of such a reading voltage is totally counterintuitive compared to conventional values of reading voltages of resistive cells known from the prior art which are much lower. The matrix according to the invention thus offers enhanced security compared to matrices known from the prior art using non-volatile resistive memories. The reading of an OTS switch (that is to say the fact of discriminating between an OFF state and an ON state of the switch) is in addition facilitated by the high ratio existing between the intensity of the current in the ON state traversing the switch and the intensity of the current in the OFF state.

An amusing parallel may be made between the matrix according to the invention and the example of writing a message on a sheet of paper with lemon juice. Once the lemon juice is dry, to read the message, it is necessary to bring the flame of a lighter close to it: if the flame is too far away, nothing is seen. If the flame is at the correct distance, the message appears. If the flame is too close, the sheet catches fire and the message is destroyed. The matrix according to the invention makes it possible to "manufacture magic ink" at the nanometric scale thanks to the use of correctly programmed OTS switches. The lemon juice on the sheet of paper is the message written by the OTS switches that have been formed in the matrix. The equivalent of a "flame too far away, which means the message is not seen", consists in reading the matrix with a reading voltage lower than the threshold voltage. The equivalent of a "flame at the correct distance, which makes the message appear" consists in reading the matrix with a reading voltage comprised between the maximum voltage of the distribution of the threshold voltages of the switches present in the matrix and the minimum voltage of the distribution of the initialization voltages of the switches present in the matrix. The equivalent of a "flame too close, which causes the sheet to catch fire and the message is destroyed" consists in reading the matrix with a reading voltage greater than the forming voltage of at least one of the non-formed switches.

Put another way, the matrix according to the invention consists in a plurality of volatile switches each comprising an OTS active layer, the switches not being in series with any other device, notably of memory type. Starting from this matrix made exclusively of OTS switches, it is then possible to write a random or predetermined message by dividing the plurality of switches into two groups, a first in which each of the volatile switches of the first group has been initialized beforehand by means of an initialization voltage and a second group in which none of the volatile switches of the second group has been initialized beforehand. This matrix consisting of a plurality of volatile OTS type switches not yet initialized and without other components present in the matrix, is also covered by the present invention.

Apart from the characteristics that have been mentioned in the preceding paragraph, the matrix according to the invention may have one or more complementary characteristics among the following, considered individually or according to all technically possible combinations thereof:
  all of the volatile switches of the matrix are structurally identical;
  each switch comprises a first electrode, a second electrode; the active layer being located between the first electrode and the second electrode;
  the first electrode comprises a layer of carbon in contact with the active layer;
  the plurality of switches is chosen such that the distribution of the threshold voltages of the switches present in the matrix and the distribution of the initialization voltages of the switches present in the matrix do not have any common voltage;
  the plurality of switches is chosen such that the current-voltage characteristic of each switch is identical below its threshold voltage whether the switch is initialized or not;
  the reading voltage used to read the message lies between the maximum voltage of the distribution of the threshold voltages of the switches present in the matrix and the minimum voltage of the distribution of the initialization voltages of the switches present in the matrix;
  the reading voltage is typically between 2V and 5V;
  said message is a random or predetermined message.

The subject matter of the invention is also a method for writing a message in a matrix comprising a plurality of volatile switches; each of said volatile switches comprising an active layer made of an OTS material and being initially non-initialized, said method comprising the application of a voltage chosen to initialize a first group of the plurality of volatile switches, the other switches of the plurality of volatile switches forming a second group not being initialized.

Apart from the characteristics that have been mentioned in the preceding paragraph, the method for writing according to the invention may have one or more complementary characteristics among the following, considered individually or according to all technically possible combinations thereof:
  said message is a predetermined message, the method comprising the following steps:
    selection of the switches forming the first group;
    application of an initialization voltage to each of the switches of the first group in such a way as to initialize each among them, without applying an initialization voltage to the other switches forming the second group;
  said message is a random message, the method comprising a step of application of a voltage to each of the switches of the plurality of switches, the voltage value being chosen to initialize a given percentage and different from 100% of switches among the plurality of switches;
  the value of the applied voltage corresponds substantially to the median value of the distribution of the initialization voltages of the plurality of switches.

The subject matter of the invention is also a method for reading the message present in a matrix according to the invention comprising a step of application of a reading voltage to each of the switches, said reading voltage being comprised between the maximum voltage of the distribution of the threshold voltages of the switches present in the matrix and the minimum voltage of the distribution of the initialization voltages of the switches present in the matrix.

The invention and the different applications thereof will be better understood on reading the description that follows and by examining the figures that accompany it.

D. BRIEF DESCRIPTION OF THE FIGURES

The figures are presented for indicative purposes and in no way limit the invention.

E. DETAILED DESCRIPTION OF AT LEAST ONE EMBODIMENT OF THE INVENTION

Unless stated otherwise, a same element appearing in the different figures has a single reference.

Figure 3:
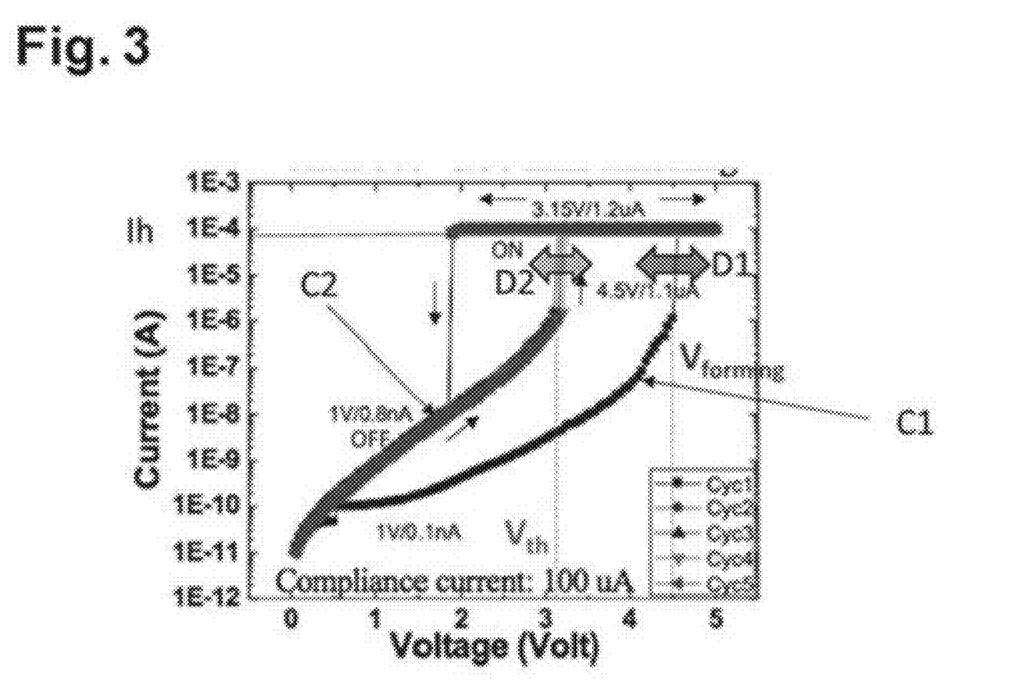
FIG. 3 illustrates the current-voltage operating principle of a switch comprising an OTS active layer.

FIGS. 1 and 2 have already been described with reference to the prior art and FIG. 3 has been described to present the general functioning of the invention.

Figure 4:
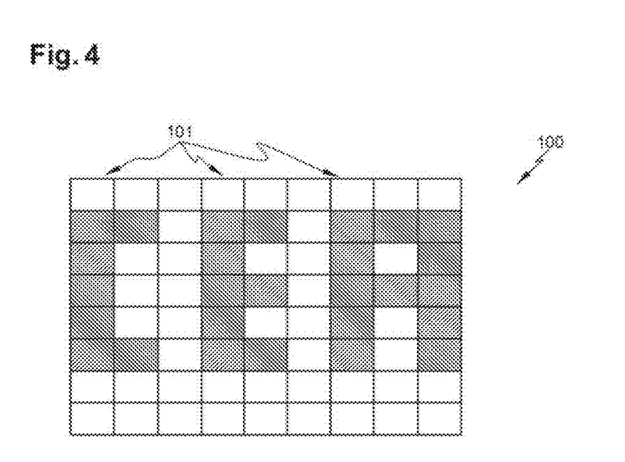
FIG. 4 shows a schematic representation of a matrix according to the invention.

FIG. 4 represents a matrix 100 according to the invention. This matrix comprises a plurality of elementary OTS (Ovonic Threshold Switching) switches 101: here the matrix comprises 72 (9 columns and 8 lines) switches, it being understood that the matrix may comprise an identical or different number of columns and lines. These switches are here all identical from a structural viewpoint, that is to say that they are made using the same materials, the same geometry and that they all have the same dimensions. The switches could not be all identical even if the fact of having identical switches has an advantage in terms of simplicity of manufacture and use. The matrix 100 may comprise a plurality of upper and lower access lines not represented here and well known to those skilled in the art (cf. for example FIG. 1), the elementary switches 101 being sandwiched at the intersection between the upper lines and the lower lines, which will enable the writing and the reading of the switches as well as their use. The architecture thus forms a network where each switch is addressable individually, by selecting the correct upper line and the correct lower line.

Figure 6:
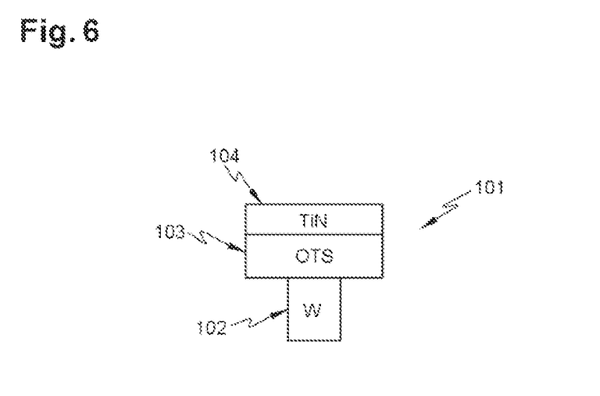
FIG. 6 shows a schematic representation of an OTS switch used in the matrix according to the invention.

An example of switch 101 is represented in FIG. 6. The switch 101 comprises:
- a layer of conductive material forming a lower electrode 102;
- an active layer made of an active OTS material 103;
- a layer of conductive material, forming an upper electrode 104.

An upper electrode of a device is defined as the electrode situated above this device and the lower electrode of a device as the electrode situated below this device, the electrodes being situated on either side of the device. Obviously, the adjective "upper" and "lower" are here relative to the orientation of the assembly including the upper electrode, the device and the lower electrode so that by turning over this assembly, the electrode previously qualified as upper becomes the lower electrode and the electrode previously qualified as lower becomes the upper electrode.

The material of the active layer 103 is of OTS type. For example, the selective active layer 1012 is made of Ge—Sb—Se—N. Other materials such as for example Ge—Se, As—Te—Al, As—Te—Al—N, Ge—Se—Te, Ge—Se—Sb, As—Ge—Te, As—Ge—Te—Si, Si—Te, C—Te, Al—Te, B—Te, Ge—Te, or As—Ge—Se—Te could be used. The thickness of the active layer 103, given for purely illustrative purposes, is of the order of 25 nm. The effect of the thickness and the choice of the OTS material on the operation of the matrix according to the invention will be seen hereafter.

The operation of such a switch 100 has already been described with reference to FIG. 3. As a reminder, the switch 100 must firstly be formed or initialized: to do so, it follows once the current-voltage characteristic C1. Once formed, it will follow the current-voltage characteristic C2. It should also be noted that the forming (or firing) and threshold voltages are capable of varying from one switch to the other, even for switches identical structurally. Thus, for a type of switch (that is to say for the same materials used both for the active layer and for the electrodes, the same dimensions and the same geometry), a distribution of the forming and threshold voltages is observed. These distributions are illustrated schematically in FIG. 3 by the references D1 (distribution of the forming or initialization voltages) and D2 (distribution of the threshold voltages). These distributions may for example take the form of a Gaussian distribution.

In the matrix 100 according to the invention, illustrated in FIG. 4, a first group of switches, the hatched switches, have been initialized whereas a second group of switches, the white switches, have not been initialized. The initialized state of certain switches makes it possible to obtain a message corresponding to the arrangement of the switches initialized in the matrix. Here, the message is a predetermined message and corresponds to the writing of the initials CEA in the matrix. To do so, the starting point is a matrix 600 represented in FIG. 5 where none of the switches has undergone firing then the switches that it is wished to form are selected: these switches are next formed individually, for example by addressing the correct upper line and the correct lower line of a cross-bar type addressing system. This type of matrix is particularly interesting in the case of "integrity check" type applications, but it will be seen hereafter that the message may also be random such that the matrix according to the invention may also be used for PUF type applications.

Figure 5:
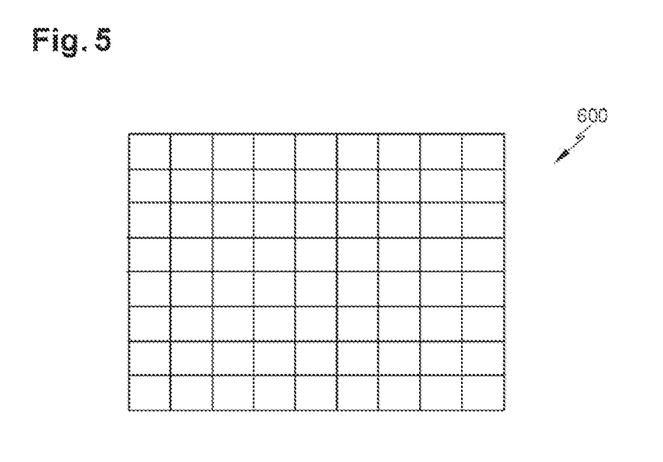
FIG. 5 shows a schematic representation of a matrix before initialization of the OTS switches.

To summarise, the method for obtaining a matrix 100 according to the invention consists in writing a message in a matrix comprising a plurality of non-initialized volatile switches such as that represented in FIG. 5. This method for writing 300 is represented schematically in FIG. 7.

Figure 7:
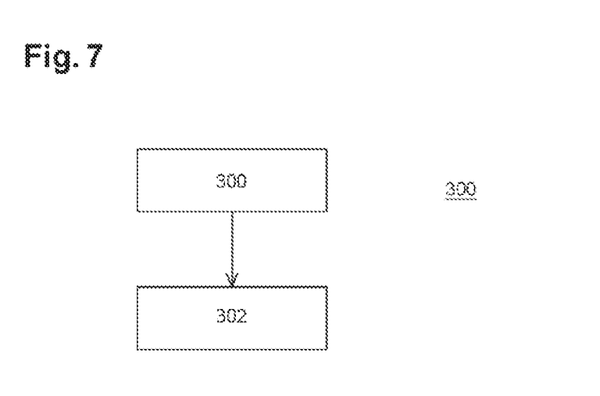
FIG. 7 represents the steps of the writing method to obtain a matrix according to the invention.

According to a first step 301, the starting point is a matrix where each of the volatile switches comprising an active layer made of an OTS material is initially non-initialized (FIG. 5). According to a step 302, a voltage chosen to initialize a first group of the plurality of volatile switches is applied, the other switches of the plurality of volatile switches forming a second group not being initialized.

This step 302 may be preceded by a step of addressing the switches forming the first group in the case where it is wished to write a predetermined message (case of the selection of the hatched switches of FIG. 4). Once these switches have been addressed, at step 302, each of these selected switches is going to see an initialization voltage applied: it is possible for example to apply to each of the selected switches an initialization voltage greater than or equal to the maximum initialization voltage of the distribution D1 of initialization voltages. This initialization voltage is not applied to the switches of the second group (or at least if a voltage is applied, its value is lower than the minimum initialization voltage of the switches of the second group).

Figure 8:
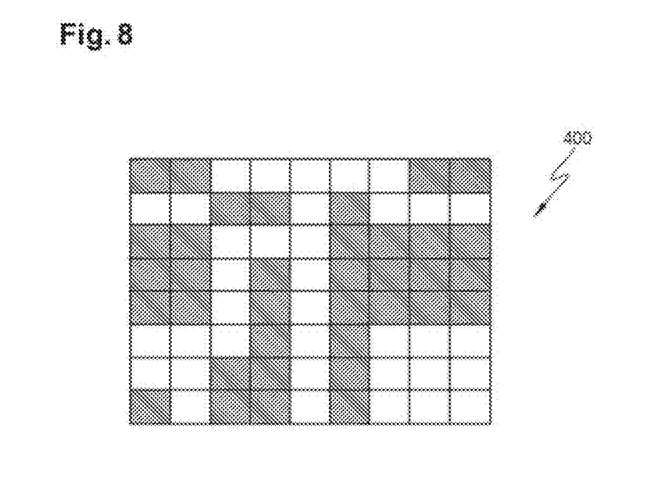
FIG. 8 shows a schematic representation of a matrix according to a second embodiment of the invention.

In the case of a random message, the message is, by definition, not known in advance. A way of writing this message is going to consist in step 302, of applying a voltage to all of the switches of the matrix of non-initialized switches. If it is wished to initialize around 50% of the switches in a random manner, it is possible to choose an initialization voltage substantially equal to the median of the distribution of the initialization voltages D1. A matrix 400 is then obtained such as that illustrated in FIG. 8 where 36 switches (out of the 72 of FIG. 5) are formed. It will be noted that it is possible to form fewer switches by choosing the forming voltage to apply according to the distribution D1 so as to obtain the ad hoc percentage of switches formed.

The method for reading the message of the matrix 100 according to the invention is going to be illustrated with reference to FIGS. 9 to 13.

Figure 9:
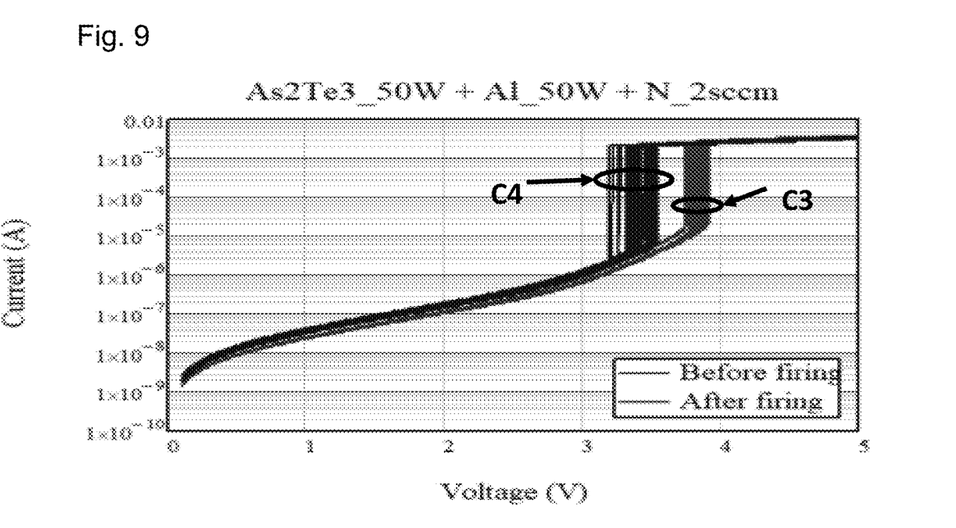
FIG. 9 represents a plurality of current-voltage characteristics corresponding to several OTS switches at the moment of initialization or forming.

FIG. 9 represents a plurality of current-voltage characteristics corresponding to several OTS switches at the moment of initialization or forming, that is to say during first use (curves C3) and after forming (curves C4), These OTS switches are all identical and are made with an active layer of AsTeAlN having a thickness of 75 nm. It is observed that the current-voltage characteristic of each switch is identical below its threshold voltage, whether the switch is initialized or not: the choice of the below threshold identity of the current-voltage characteristics is advantageous in the case of the matrix according to the invention to avoid the contrasts which could appear at the level of the current during reading of the message. However, it is also possible to take switches having different below threshold characteristics before and after forming in a slightly degraded mode (case of the characteristics of FIG. 3, which do not follow below the threshold). The hypothesis is the following: the starting point is a matrix 100 such as illustrated in FIG. 4 in which a first group of switches has been formed in such a way as to write the abbreviation CEA.

Figure 10:
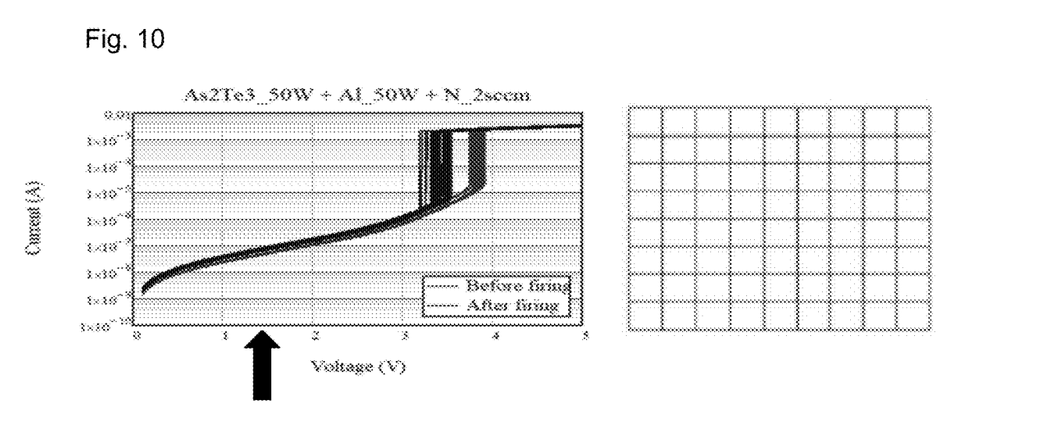
FIGS. 10 to 13 illustrate the method for reading a matrix according to the invention.

In FIG. 10, a voltage (the value of which is represented by the black arrow) is applied to all of the switches of the matrix. This voltage is lower than the threshold voltages of all of the switches such that none of the switches is in the ON state, all of the switches remaining in the high resistance state (represented by the switches on white background).

Figure 11:
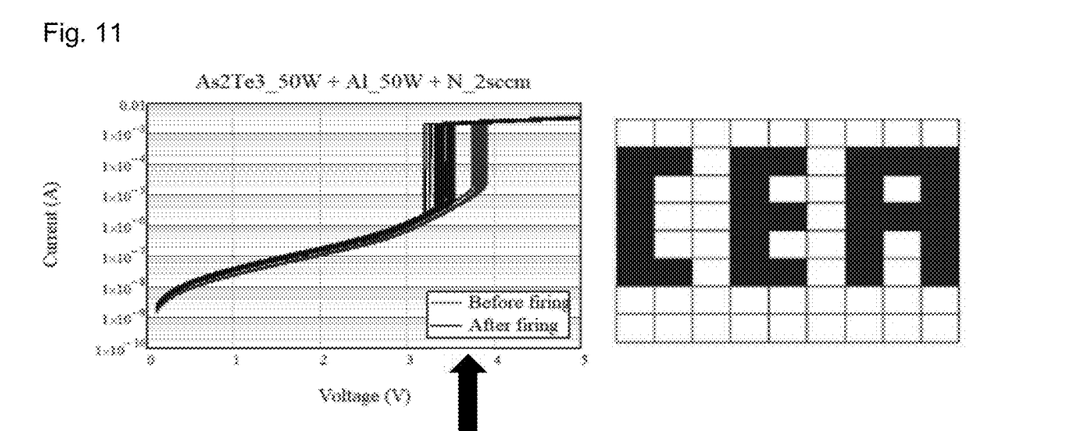

In FIG. 11, a voltage (the value of which is represented by the black arrow) is applied to all of the switches of the matrix. This reading voltage is comprised between the maximum voltage of the distribution of the threshold voltages of the switches present in the matrix and the minimum voltage of the distribution of the initialization voltages of the switches present in the matrix. Thus, the switches that were not initialized are read with a very high resistance at this voltage (even if the voltage is greater than their threshold voltage): only the initialized or formed switches (represented in hatched form in FIG. 4) see their resistance switch from the OFF state to the ON state such that the message CEA may be read by discriminating between the OTS switches having a high resistance and those being in the ON state.

Figure 12:
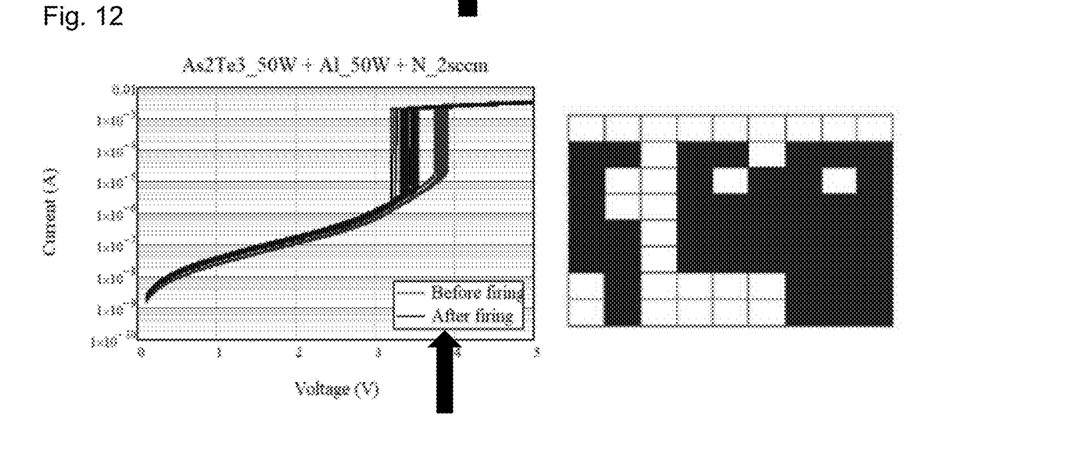

In FIG. 12, a voltage (the value of which is represented by the black arrow) is applied to all of the switches of the matrix. This voltage is situated within the distribution of the initialization voltages of the switches present in the matrix. Thus, certain switches which were not initialized in FIG. 4 are formed and see their resistance switch from the OFF state in the ON state in addition to the switches already initialized in FIG. 4 such that the message CEA is made illegible in an irreversible manner.

Figure 13:
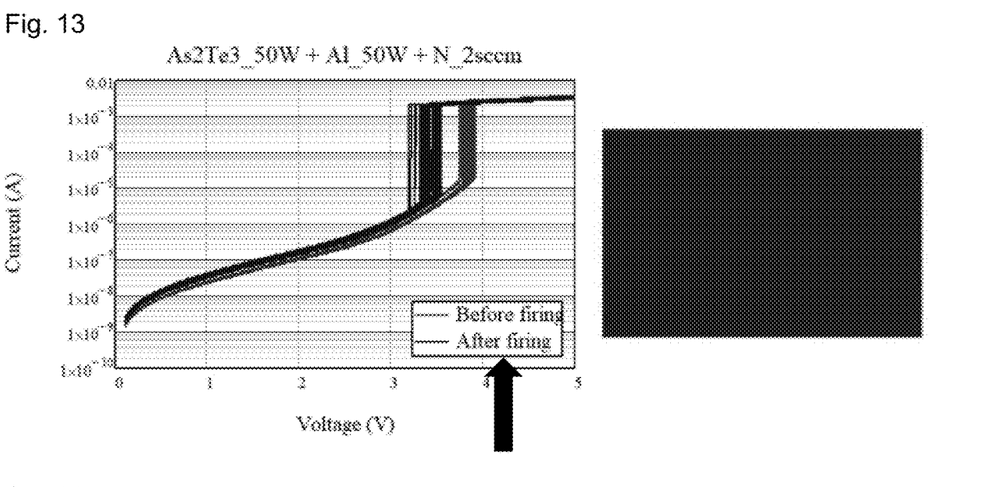

In FIG. 13, a voltage (the value of which is represented by the black arrow) is applied to all of the switches of the matrix. This voltage is greater than the maximum voltage of the distribution of the initialization voltages such that all of the switches of the matrix are formed, making the message totally illegible.

Thus, to correctly read the message without damaging it, it is necessary to place oneself at a well determined reading voltage situated over a given range of voltages depending on the threshold and forming voltage distributions and thus on all of the characteristics of the OTS switches used, such as the OTS material, the materials of the electrodes, the geometry and the dimensions of the layers and notably the thickness of the layers. The reading of a matrix comprising a random message such as that of FIG. 8, notably within the context of a PUF application, is performed in a similar manner. It will be noted that it is also possible to carry out the integrity check with a PUF application: typically, it is known that 50% of the switches have been formed. If it is realised on reading the switches that the percentage of switches formed has notably changed, this may signify that the integrity of the device is called into question.

Figure 14:
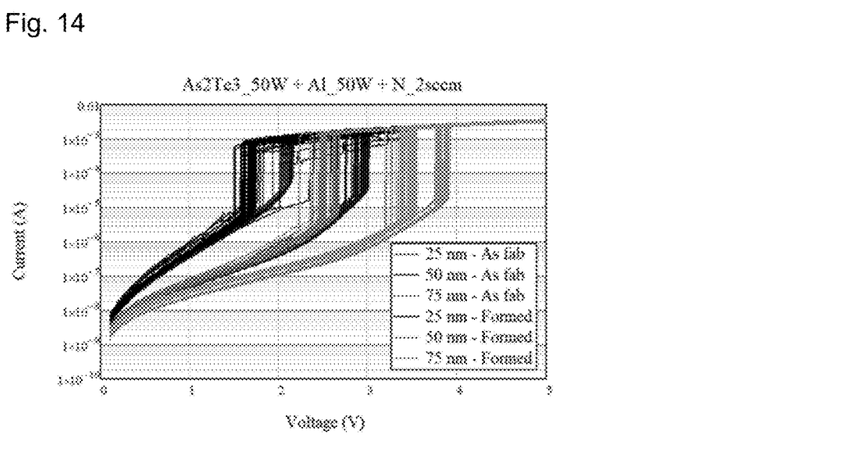
FIG. 14 represents different distributions of current-voltage characteristics before and after initialization for OTS switches made with the same material.

It is also particularly advantageous that the distributions of the threshold and forming voltages of the switches present in the matrix are disjointed (case of the distributions C3 and C4 of FIG. 9, which do not have any voltage in common). In this respect, it may be observed that the thickness of the OTS active layer can substantially modify the threshold and forming voltage distributions. As an illustration, FIG. 14 represents different distributions of current-voltage characteristics before and after initialization for OTS switches made with the same material AsTeAlN of active layer but for three different thicknesses: 25 nm, 50 nm and 75 nm. It is observed that the threshold and forming voltage distributions are indeed disjointed for a thickness of 75 nm but that they have common points for thicknesses of 25 nm and 50 nm, increasing the risk of error during reading of the matrices according to the invention. It is thus particularly advantageous to choose the threshold and initialization thickness of the active layer of the OTS switches in order that the distributions of the voltages are indeed disjointed.

Figure 15:
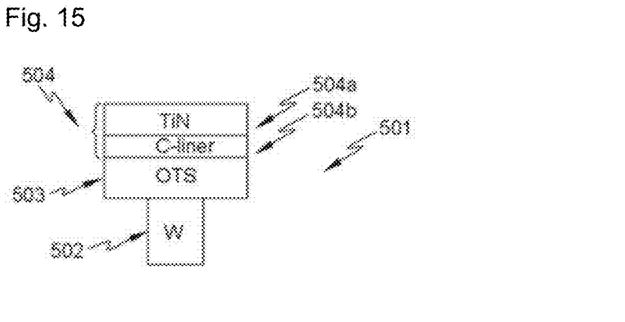
FIG. 15 represents another example of switch that can be used in the matrix according to the invention.

Another example of switch 501 that can be used in the matrix according to the invention is represented in FIG. 15. The switch 501 comprises:
  a layer of conductive material made of tungsten W forming the lower electrode 502;

an active layer made of an active OTS material 503, here GeSbSeN;

an upper electrode 504 including:

a layer of conductive material made of TiN 504a a layer of C also called C-liner 504b in contact with the active layer 503.

The switch 501 thus differs from the switch 101 by the addition of the liner made of carbon C 504b.

The layer of C 540b is notably used when a layer of conductive material 540a is used which diffuses into the active layer, for example the Ti in the TiN layer 504a can diffuse into the OTS layer 503. The advantage of carbon is that it is inert with the OTS material and that it does not diffuse therein. Thus, the layer of C plays the role of diffusion barrier. Carbon is only an illustrative example and other materials could be used as diffusion barrier. Thus, layers based on W, Ta or Mo used as inert material could be envisaged for the electrodes or for the realisation of the diffusion barrier.

Figure 16:
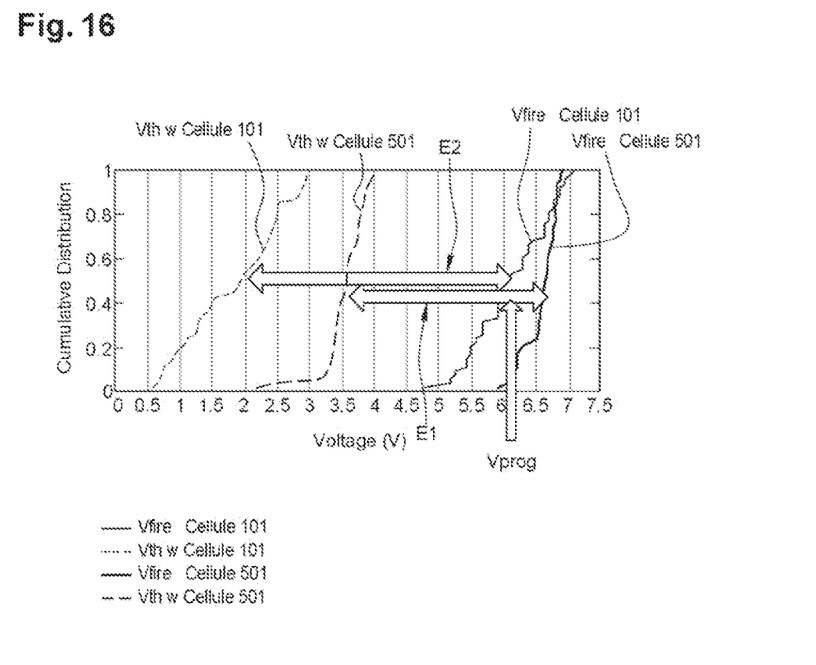
FIG. 16 represents the cumulative distribution as a function of the threshold and initialization voltage for the two types of switches of FIGS. 6 and 15.

FIG. 16 illustrates the effect of the addition of the layer of C 504b on the voltage distributions between the switch 101 and the switch 501. FIG. 16 represents the cumulative distribution (i.e. the percentage of switches concerned in the matrix according to the invention) as a function of the threshold and initialization voltage (also called forming or firing voltage) for the two types of switches 101 and 501. It may be observed in this figure that the addition of the layer of C has an impact on the shape of the distributions and on the difference therebetween. A smaller difference E1 is observed between the medians of the threshold and initialization voltage distributions in the case of switches 501 with the addition of a layer of C than the difference E2 in the case of switches 101, This smaller difference has an immediate effect on the difficulty of access to the message stored in the matrix according to the invention. Indeed, it will be much more difficult to find the appropriate reading voltage when the difference between the distributions is reduced without taking the risk of erasing and reducing the integrity of the message. Thus, for applications requiring a high degree of security, the addition of a layer of C (or in a more general manner a layer of inert material compared to the OTS active layer) in the switches may have an interest. Conversely, the choice of the forming voltage Vprog notably making it possible to form 50% of the switches randomly will be easier in the case of switches 101 without layer of C. Indeed, the slope of the distribution being greater, the precision of the number of switches formed will be greater. There is thus an arbitration to be made as a function of the type of targeted applications.

Figure 17:
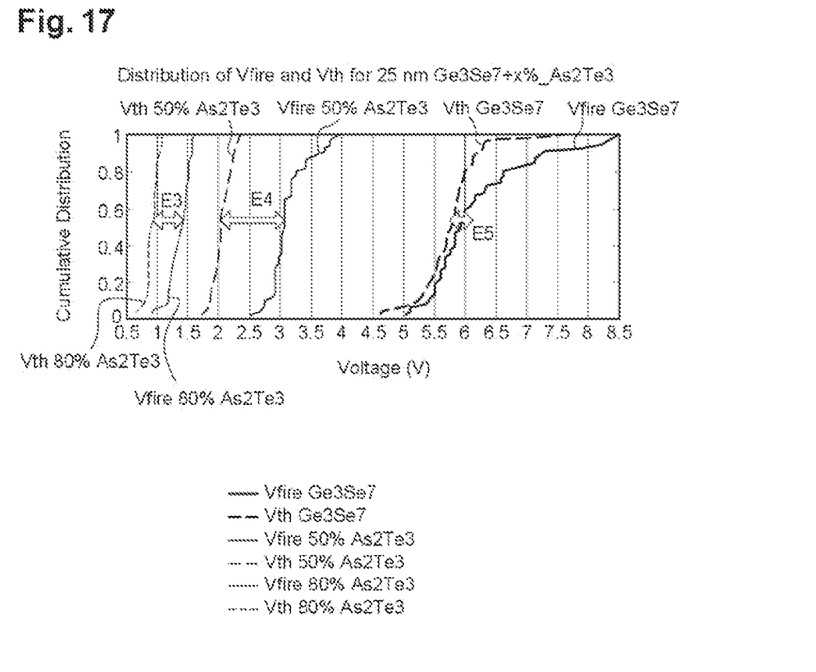
FIG. 17 shows the cumulative distribution as a function of the threshold and initialization voltage for three different materials used for the OTS active layer.

As mentioned above, the type of material may also have an effect on the threshold and forming voltage distributions. This phenomenon is illustrated in FIG. 17, which shows the cumulative distribution (i.e. the percentage of switches concerned in the matrix according to the invention) as a function of the threshold and initialization voltage (also called forming or firing voltage) for three different materials used for the OTS active layer with a same thickness of 25 nm:

$Ge_3Se_7$ alloy $Ge_3S_7+50\%$ $AsSTe_3$ alloy $Ge_3S_7+80\%$ $AsSTe_3$ alloy

It is observed that the difference E3, E4 and E5 between the threshold and initialization voltage distributions varies substantially according to the material used with a much smaller difference E5 for the material $GeSe_7$. Thus, as a function of the targeted application and the desired degree of security, the choice of the OTS material will thus have an important influence.

Other parameters may also make it possible to adjust the operation of the matrix according to the invention. Thus, certain OTS materials are more or less temperature sensitive, which can considerably modify the electrical behaviour thereof. The choice of an OTS material that is not very temperature sensitive may be interesting in the case where it is wished to integrate the chip forming the matrix according to the invention in a casing requiring soldering at high temperature (typically of the order of 260° C.): materials based on GeSe are good examples of not very temperature sensitive materials.

The invention claimed is:

1. A matrix comprising a plurality of volatile switches, each of said volatile switches comprising an active layer made of an ovonic threshold switching (OTS) material, the plurality of volatile switches being divided into first and second groups in such a way as to form a message, each of the volatile switches of the first group having been initialized beforehand by an initialization voltage, none of the volatile switches of the second group having been initialized beforehand, said message being formed by the initialized or non-initialized states of each of the switches of the matrix.

2. The matrix according to claim 1, wherein all of the volatile switches of the matrix are structurally identical.

3. The matrix according to claim 1, wherein each switch comprises a first electrode, a second electrode, the active layer being located between the first electrode and the second electrode.

4. The matrix according to claim 3, wherein the first electrode comprises a layer of carbon in contact with the active layer.

5. The matrix according to claim 1, wherein the plurality of switches is chosen such that a distribution of the threshold voltages of the switches present in the matrix and a distribution of the initialization voltages of the switches present in the matrix do not have any common voltage.

6. The matrix according to claim 1, wherein the plurality of switches is chosen such that the current-voltage characteristic of each switch is identical below its threshold voltage whether the switch is initialized or not.

7. The matrix according to claim 1, wherein the reading voltage used to read the message lies between a maximum voltage of a distribution of the threshold voltages of the switches present in the matrix and a minimum voltage of a distribution of the initialization voltages of the switches present in the matrix.

8. The matrix according to claim 1, wherein said message is a random or predetermined message.

9. A method for initializing a matrix comprising a plurality of volatile switches, each of said volatile switches comprising an active layer made of an ovonic threshold switching (OTS) material and being initially non-initialized, said method comprising applying a voltage chosen to initialize a first group of the plurality of volatile switches, the other switches of the plurality of volatile switches forming a second group not being initialized.

10. The method for initializing according to claim 9, wherein said message is a predetermined message, the method comprising:

selecting the switches forming the first group;

applying an initialization voltage to each of the switches of the first group in such a way as to initialize each among them, without applying an initialization voltage to the other switches forming the second group.

11. The method for initializing according to claim 9, wherein said message is a random message, the method comprising applying a voltage to each of the switches of the plurality of switches, a voltage value being chosen to initialize a given percentage and different from 100% of switches among the plurality of switches.

12. The method for initializing according to claim 11, wherein the value of the applied voltage corresponds substantially to a median value of the distribution of the initialization voltages of the plurality of switches.

13. A method for reading the message present in a matrix according to claim 1 comprising applying a reading voltage to each of the switches, said reading voltage being comprised between a maximum voltage of a distribution of the threshold voltages of the switches present in the matrix and a minimum voltage of a distribution of the initialization voltages of the switches present in the matrix.

* * * * *